US010750250B1

(12) United States Patent
Parker et al.

(10) Patent No.: US 10,750,250 B1
(45) Date of Patent: Aug. 18, 2020

(54) GROUNDING ASSEMBLY FOR OPTICAL MODULES

(71) Applicant: Fujitsu Limited, Kawasaki-shi, Kanagawa OT (JP)

(72) Inventors: Charlie Wesly Parker, Richardson, TX (US); Stewart Henry Hiebert, Lake Dallas, TX (US); Casey Daniels, Richardson, TX (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 16/418,262

(22) Filed: May 21, 2019

(51) Int. Cl.
| H05K 7/00 | (2006.01) |
| H04Q 1/04 | (2006.01) |
| H05K 7/14 | (2006.01) |
| H01R 43/26 | (2006.01) |
| H01R 4/48 | (2006.01) |
| H01R 4/66 | (2006.01) |

(52) U.S. Cl.
CPC .............. *H04Q 1/04* (2013.01); *H01R 4/48* (2013.01); *H01R 4/66* (2013.01); *H01R 43/26* (2013.01); *H05K 7/1427* (2013.01)

(58) Field of Classification Search
USPC ................... 361/728, 799, 816, 818
See application file for complete search history.

(56) References Cited

U.S. PATENT DOCUMENTS

| 7,327,584 B2* | 2/2008 | Ice ..................... H05K 7/1404 361/756 |
| 7,738,262 B2* | 6/2010 | Sato ................... H05K 9/0007 361/800 |
| 2002/0114145 A1* | 8/2002 | Ruff .................... H05K 7/1405 361/801 |
| 2003/0087540 A1* | 5/2003 | Dawson ............ H01R 13/6485 439/181 |

* cited by examiner

Primary Examiner — Hung S. Bui
(74) Attorney, Agent, or Firm — Baker Botts L.L.P.

(57) ABSTRACT

A grounding clip for a plug-in universal (PIU) module enclosure in an optical network element includes a first wing portion shaped to be positioned between and in contact with a first side of a faceplate of the network element and the chassis, a second wing portion shaped to be positioned between and in contact with a second side of the faceplate and the chassis, and a center portion shaped to extend over and to be in contact with the PIU module enclosure when the grounding assembly is installed in the network element. The grounding clip includes an opening through which a fastener electrically and mechanically couples the grounding clip to a printed circuit board (PCB) and to the chassis when installed, the PCB being installed within the chassis and configured to be communicably coupled to a PIU module when the PIU module is installed in the PIU module enclosure.

20 Claims, 11 Drawing Sheets

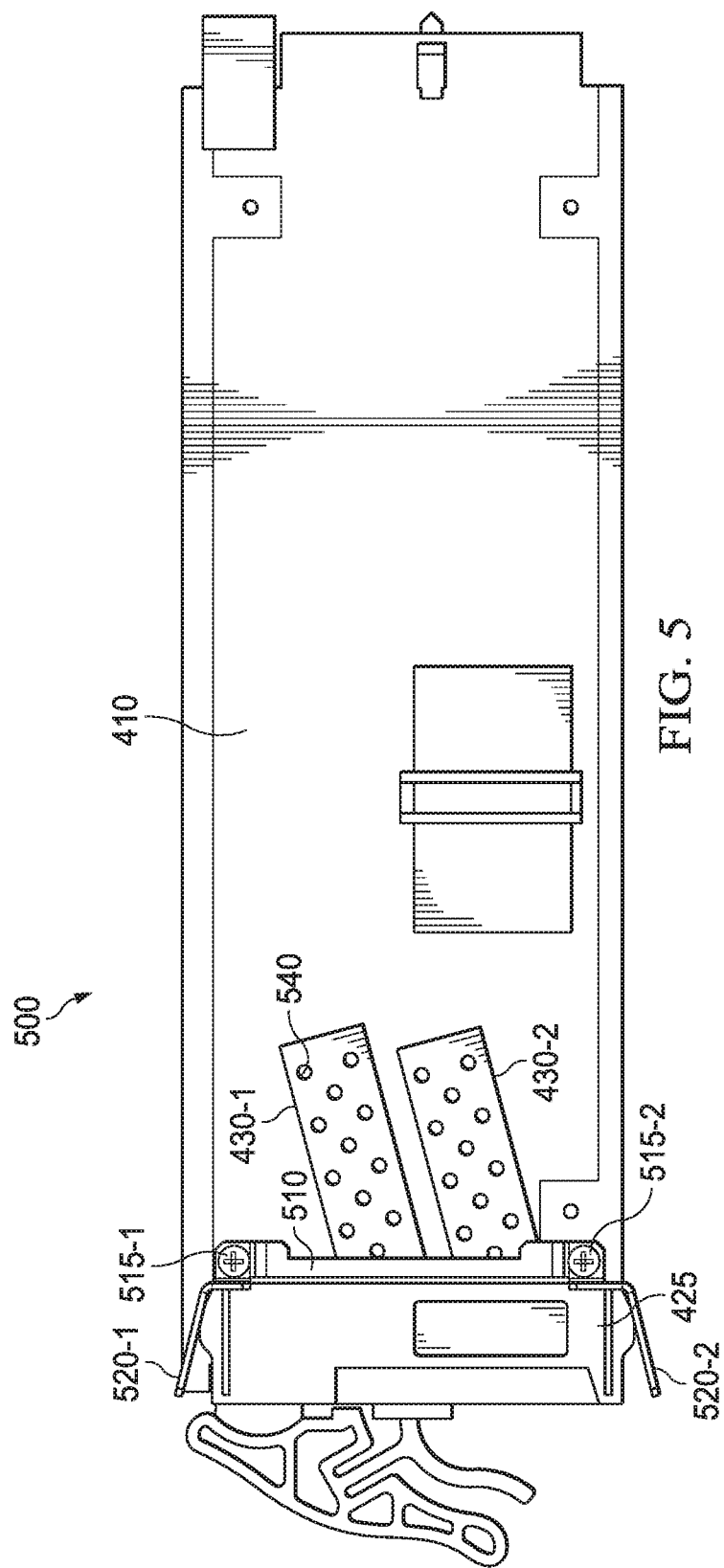

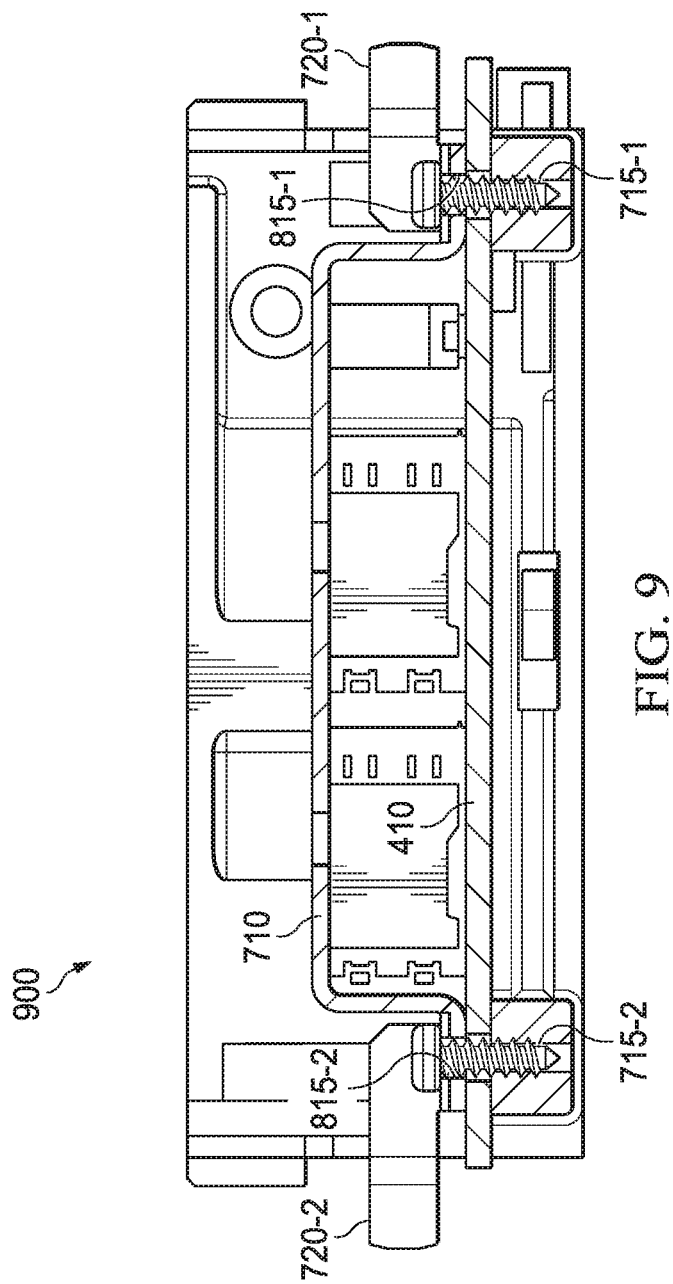

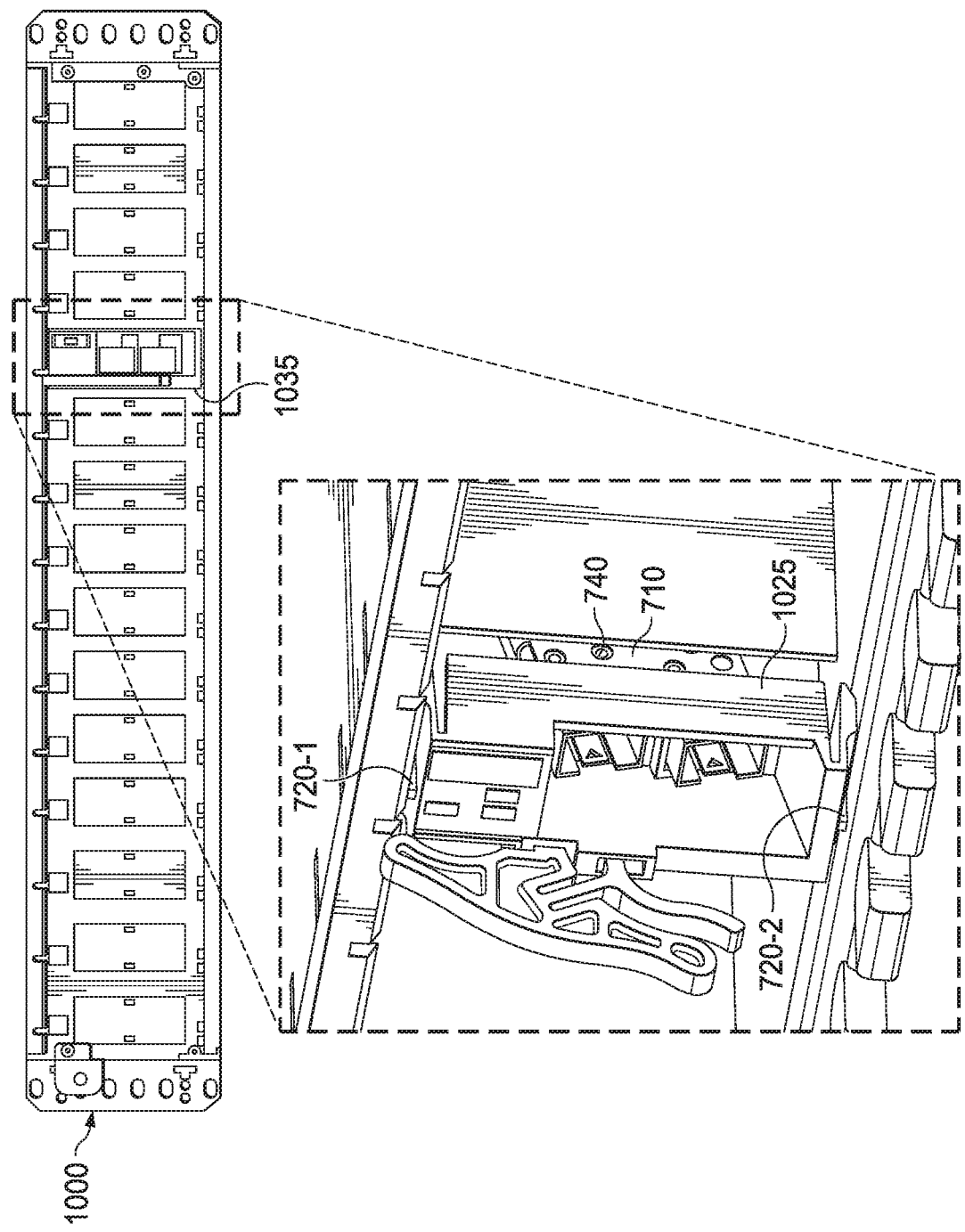

GROUNDING ASSEMBLY FOR OPTICAL MODULES

BACKGROUND

Field of the Disclosure

The present disclosure relates generally network elements of optical transport networks and, more particularly, to a grounding assembly for optical modules.

Description of the Related Art

Telecommunication, cable television and data communication systems use optical transport networks (OTN) to rapidly convey large amounts of information between remote points. In an OTN, information is conveyed in the form of optical signals through optical fibers, where multiple sub-channels may be carried within an optical signal. OTNs may also include various network elements, such as amplifiers, dispersion compensators, multiplexer/demultiplexer filters, wavelength selective switches, optical switches, couplers, etc. configured to perform various operations within the network.

Some network elements are or include pluggable modules that are installed in various chassis, racks, or other enclosures at respective nodes of the optical transport network.

BRIEF DESCRIPTION OF THE DRAWINGS

For a more complete understanding of the present invention and its features and advantages, reference is now made to the following description, taken in conjunction with the accompanying drawings, in which:

FIG. 5 illustrates selected elements of an optical network element in which a first example grounding assembly is installed, in accordance with some embodiments;

FIG. 9 illustrates a cutaway view of selected elements of an optical network element in which a grounding assembly is installed, in accordance with some embodiments;

FIG. 10 illustrates a rack for multiple network elements and an exploded view of one of the network elements, in accordance with some embodiments.

SUMMARY

Figure 1:
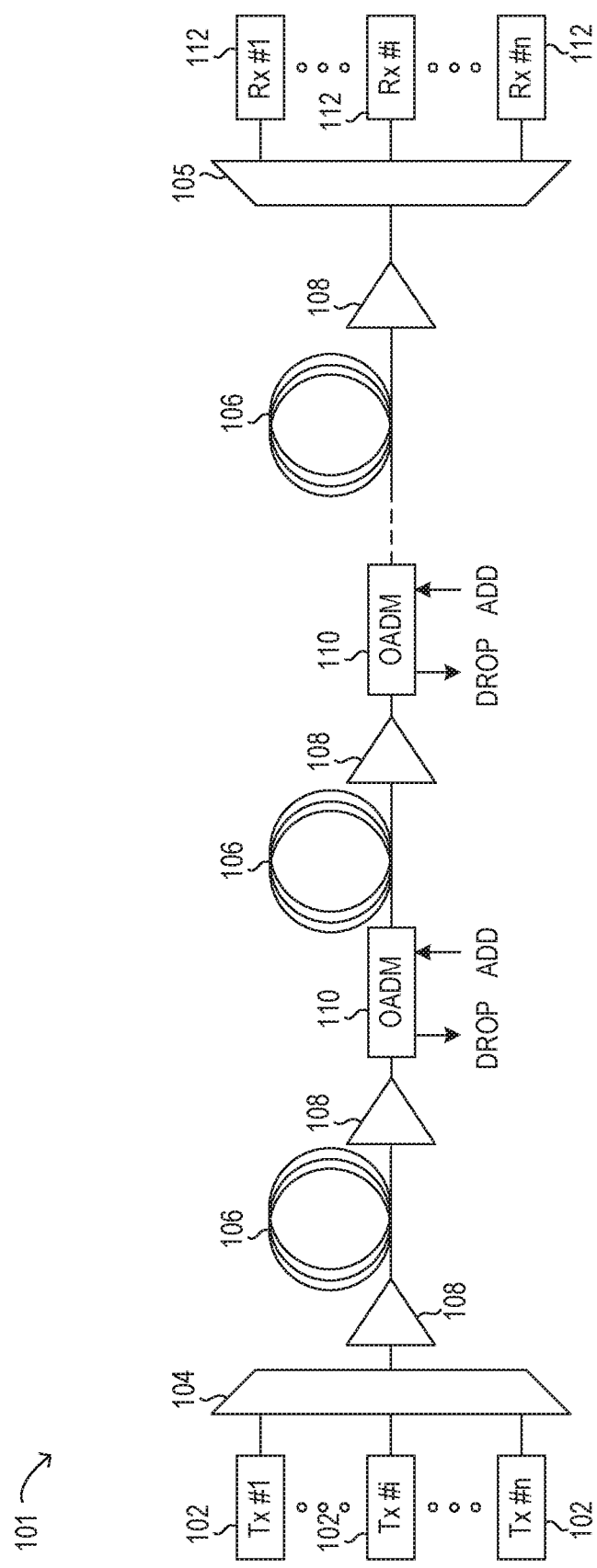
FIG. 1 is a block diagram of selected elements of an embodiment of an optical transport network.

In one aspect, a network element in an optical transport network includes a plug-in universal (PIU) module enclosure into which a PIU module is received during installation of the PIU module in the network element, a chassis within which the PIU module enclosure is installed in the network element, a printed circuit board (PCB) installed within the chassis and configured to be communicably coupled to the PIU module when the PIU module is installed in the network element, a faceplate mechanically coupled to the PCB through which the PIU module is inserted into the PIU module enclosure when installing the PIU module in the network element, and a grounding assembly. The grounding assembly includes a grounding clip and a fastener. The grounding clip includes a first wing portion positioned between a first side of the faceplate and the chassis and in contact with the first side of the faceplate and the chassis when the grounding assembly is installed in the network element, a second wing portion positioned between a second side of the faceplate and the chassis and in contact with the second side of the faceplate and the chassis when the grounding assembly is installed in the network element, the second side of the faceplate being opposite the first side of the faceplate, and a center portion between the first wing portion and the second wing portion shaped to extend over and to be in contact with at least a portion of the PIU module enclosure when the grounding assembly is installed in the network element. The fastener is to electrically and mechanically couple the grounding clip to the PCB when the grounding assembly is installed in the network element.

In any of the disclosed embodiments, the grounding clip may be fashioned as a single piece of a metal or a metal alloy exhibiting spring properties. The first wing portion may be shaped to snap onto the first side of the faceplate and exert a force on the chassis to hold the grounding clip in position to make contact with the chassis, and the second wing portion may be shaped to snap onto the second side of the faceplate and exert a force on the chassis to hold the grounding clip in position to make contact with the chassis.

In any of the disclosed embodiments, the first wing portion may extend away from a first side of the center portion in a direction toward the faceplate at an angle of between 70 and 80 degrees with respect to a line running across the center portion between the first and second wing portions, and the second wing portion may extend away from a second side of the center portion opposite the first side of the center portion in a direction toward the faceplate at an angle of between 70 and 80 degrees with respect to the line running across the center portion between the first and second wing portions.

In any of the disclosed embodiments, the faceplate may be fashioned from a plastic material.

In any of the disclosed embodiments, the center portion may include one or more perforations that are aligned with respective ventilation perforations on the PIU module enclosure when the PIU module enclosure is installed in the network element.

In any of the disclosed embodiments, the PIU module enclosure may be a PIU module enclosure of a first enclosure type, and the center portion may further include one or more additional perforations that are aligned with respective ventilation perforations on a PIU module enclosure of a second enclosure type when the PIU module enclosure of the second enclosure type is installed in the network element.

In any of the disclosed embodiments, the center portion may be shaped to extend over and to be in contact with greater than fifty percent of a surface of the PIU module enclosure when the grounding assembly is installed in the network element.

In any of the disclosed embodiments, the network element may further include an additional PIU module enclosure into which an additional PIU module is received during installation of the additional PIU module in the network element. The center portion may be shaped to extend over and to be in contact with the at least a portion of the PIU module enclosure and at least a portion of the additional PIU module enclosure when the grounding assembly is installed in the network element.

In any of the disclosed embodiments, the fastener may include one or more screws shaped to pass through respective openings in the grounding clip and the PCB and to make contact with the chassis.

In another aspect, a grounding clip for a plug-in universal (PIU) module enclosure includes a first wing portion shaped to be positioned between a first side of a faceplate of an optical network element and a chassis within which the PIU module enclosure is installed in the network element such that the first wing portion is in contact with the first side of the faceplate and the chassis when the grounding clip is installed in the network element, a second wing portion shaped to be positioned between a second side of the faceplate and the chassis such that the second wing portion is in contact with the second side of the faceplate and the chassis when the grounding clip is installed in the network element, the second side of the faceplate being opposite the first side of the faceplate, and a center portion between the first wing portion and the second wing portion shaped to extend over and to be in contact with at least a portion of the PIU module enclosure when the grounding assembly is installed in the network element. The grounding clip further includes an opening through which a fastener electrically and mechanically couples the grounding clip to a printed circuit board (PCB) and to the chassis when the grounding assembly is installed in the network element, the PCB being installed within the chassis and configured to be communicably coupled to a PIU module when the PIU module is installed in the PIU module enclosure.

In any of the disclosed embodiments, the grounding clip may be fashioned as a single piece of a metal or a metal alloy exhibiting spring properties. The first wing portion may be shaped to snap onto the first side of the faceplate and exert a force on the chassis to hold the grounding clip in position to make contact with the chassis, and the second wing portion may be shaped to snap onto the second side of the faceplate and exert a force on the chassis to hold the grounding clip in position to make contact with the chassis.

In any of the disclosed embodiments, the first wing portion may extend away from a first side of the center portion in a direction toward the faceplate at an angle of between 70 and 80 degrees with respect to a line running across the center portion between the first and second wing portions, and the second wing portion may extend away from a second side of the center portion opposite the first side of the center portion in a direction toward the faceplate at an angle of between 70 and 80 degrees with respect to the line running across the center portion between the first and second wing portions.

In any of the disclosed embodiments, the center portion may include one or more perforations that are aligned with respective ventilation perforations on the PIU module enclosure when the PIU module enclosure and the grounding clip are installed in the network element.

In any of the disclosed embodiments, the center portion may include one or more perforations that are aligned with respective ventilation perforations on a PIU module enclosure of a first enclosure type when the PIU module enclosure of the first enclosure type and the grounding clip are installed in the network element, and one or more perforations that are aligned with respective ventilation perforations on a PIU module enclosure of a second enclosure type when the PIU module enclosure of the second enclosure type and the grounding clip are installed in the network element.

In any of the disclosed embodiments, the center portion may be shaped to extend over and to be in contact with greater than fifty percent of a surface of the PIU module enclosure when the PIU module enclosure and the grounding assembly are installed in the network element.

In any of the disclosed embodiments, the center portion may be shaped to extend over and to be in contact with the at least a portion of the PIU module enclosure and at least a portion of an additional PIU module enclosure when the PIU module enclosure, the additional PIU module enclosure, and the grounding assembly are installed in the network element.

In yet another aspect, a method for installing a grounding assembly for a plug-in universal (PIU) module in a chassis of a network element includes installing, in the chassis, a printed circuit board (PCB) configured to be communicably coupled to the PIU module when the PIU module is installed in the network element, installing a PIU module enclosure within the chassis, mechanically coupling a faceplate to the PCB and to the PIU module enclosure through which the PIU module is inserted into the PIU module enclosure when installing the PIU module in the network element, installing a grounding clip within the chassis such that a first wing portion of the grounding clip is positioned between a first side of the faceplate and the chassis so as to be in contact with the first side of the faceplate and the chassis, a second wing portion of the grounding clip is positioned between a second side of the faceplate and the chassis so as to be in contact with the second side of the faceplate and the chassis, the second side of the faceplate being opposite the first side of the faceplate, and a center portion of the grounding clip between the first wing portion and the second wing portion extends over and is in contact with at least a portion of the PIU module enclosure, and installing a fastener to electrically and mechanically couple the grounding clip to the PCB and to the chassis.

In any of the disclosed embodiments, the grounding clip may be fashioned as a single piece of a metal or a metal alloy exhibiting spring properties. Installing the grounding clip within the chassis may include snapping the first wing portion onto the first side of the faceplate, and snapping the second wing portion onto the second side of the faceplate. The first wing portion may be shaped to exert a force on the chassis to hold the grounding clip in position to make contact with the first side of the faceplate and the chassis subsequent to installing the grounding clip, and the second wing portion may be shaped to exert a force on the chassis to hold the grounding clip in position to make contact with the second side of the faceplate and the chassis subsequent to installing the grounding clip.

In any of the disclosed embodiments, installing the fastener may include inserting one or more screws through respective openings in the grounding clip and the PCB such that they make contact with the grounding clip, the PCB, and the chassis.

In any of the disclosed embodiments, the method may further include fashioning the grounding clip from a single piece of a metal or a metal alloy exhibiting spring properties.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

In some optical transport networks, network elements may be or include pluggable modules that are installed in various chassis, racks, or other enclosures at respective nodes of the optical transport network. For example, a network element may be or include a plug-in universal (PIU) module, such as a PIU module having a form factor consistent with the C form-factor pluggable (CFP) specification or a variant of the CFP specification (e.g., the CFP2 specification), and one or more PIU module enclosures consistent with the CFP (or applicable CFP variant) specification. Pluggable optical module designs are increasingly moving from modules with heights of two rack units (2RU modules) to modules with heights of one rack unit (1RU modules). The network element may also include a printed circuit board (PCB) installed within the chassis and configured to be communicably coupled to a PIU module when the PIU module is installed in the PIU module enclosure.

As will be disclosed in further detail below, the systems and methods described herein may be used to install a grounding assembly that makes a direct electrical and mechanical connection between the PIU module enclosures cages, the PCB board, and the chassis to ground the PIU module enclosures and PCB to the chassis and enable the network element to meet electrostatic discharge (ESD) guidelines. More specifically, the systems described herein may include a grounding clip for a PIU module enclosure that includes a first wing portion shaped to be positioned between and in contact with a first side of a faceplate of the network element and the chassis, a second wing portion shaped to be positioned between and in contact with a second side of the faceplate and the chassis, and a center portion shaped to extend over and to be in contact with the PIU module enclosure when the grounding assembly is installed in the network element. The grounding clip may include an opening through which a fastener electrically and mechanically couples the grounding clip to the PCB and to the chassis when installed Turning now to the drawings, FIG. 1 illustrates an example embodiment of an optical transport network 101, which may represent an optical communication system. Optical transport network 101 may include one or more optical fibers 106 configured to transport one or more optical signals communicated by components of optical transport network 101. The network elements of optical transport network 101, coupled together by fibers 106, may comprise one or more transmitters 102, one or more multiplexers (MUX) 104, one or more optical amplifiers 108, one or more optical add/drop multiplexers (OADM) 110, one or more demultiplexers (DEMUX) 105, and one or more receivers 112.

Optical transport network 101 may comprise a point-to-point optical network with terminal nodes, a ring optical network, a mesh optical network, or any other suitable optical network or combination of optical networks. Optical fibers 106 comprise thin strands of glass capable of communicating the signals over long distances with very low loss. Optical fibers 106 may comprise a suitable type of fiber selected from a variety of different fibers for optical transmission.

Optical transport network 101 may include devices configured to transmit optical signals over optical fibers 106. Information may be transmitted and received through optical transport network 101 by modulation of one or more wavelengths of light to encode the information on the wavelength. In optical networking, a wavelength of light may also be referred to as a channel. Each channel may be configured to carry a certain amount of information through optical transport network 101. To increase the information capacity and transport capabilities of optical transport network 101, multiple signals transmitted at multiple channels may be combined into a single wideband optical signal. The process of communicating information at multiple channels is referred to in optics as wavelength division multiplexing (WDM).

Optical transport network 101 may include one or more optical transmitters (Tx) 102 configured to transmit optical signals through optical transport network 101 in specific wavelengths or channels. Transmitters 102 may comprise a system, apparatus or device configured to convert an electrical signal into an optical signal and transmit the optical signal. For example, transmitters 102 may each comprise a laser and a modulator to receive electrical signals and modulate the information contained in the electrical signals onto a beam of light produced by the laser at a particular wavelength, and transmit the beam for carrying the signal throughout optical transport network 101.

Multiplexer 104 may be coupled to transmitters 102 and may be a system, apparatus or device configured to combine the signals transmitted by transmitters 102, e.g., at respective individual wavelengths, into a WDM signal.

Optical amplifiers 108 may amplify the multi-channeled signals within optical transport network 101. Optical amplifiers 108 may be positioned before and after certain lengths of fiber 106. Optical amplifiers 108 may comprise a system, apparatus, or device configured to amplify optical signals. For example, optical amplifiers 108 may comprise an optical repeater that amplifies the optical signal. This amplification may be performed with opto-electrical (O-E) or electro-optical (E-O) conversion. In some embodiments, optical amplifiers 108 may comprise an optical fiber doped with a rare-earth element to form a doped fiber amplification element. As an example, optical amplifiers 108 may comprise an erbium-doped fiber amplifier (EDFA).

OADMs 110 may be coupled to optical transport network 101 via fibers 106. OADMs 110 comprise an add/drop module, which may include a system, apparatus or device configured to add or drop optical signals (i.e., at individual wavelengths) from fibers 106. After passing through an OADM 110, an optical signal may travel along fibers 106 directly to a destination, or the signal may be passed through one or more additional OADMs 110 and optical amplifiers 108 before reaching a destination. In certain embodiments of optical transport network 101, OADM 110 may represent a reconfigurable OADM (ROADM) that is capable of adding or dropping individual or multiple wavelengths of a WDM signal. The individual or multiple wavelengths may be added or dropped in the optical domain, for example, using a wavelength selective switch (WSS) (not shown) that may be included in a ROADM.

As shown in FIG. 1, optical transport network 101 may also include one or more demultiplexers 105 at one or more destinations of network 101. Demultiplexer 105 may comprise a system apparatus or device that acts as a demultiplexer by splitting a single composite WDM signal into individual channels at respective wavelengths. In one example, optical transport network 101 may transmit and carry a forty (40) channel DWDM signal, and demultiplexer 105 may divide the single, forty channel DWDM signal into forty separate signals according to the forty different channels. It will be understood that different numbers of channels or subcarriers may be transmitted and demultiplexed in optical transport network 101, in various embodiments In FIG. 1, optical transport network 101 may also include receivers 112 coupled to demultiplexer 105. Each receiver 112 may be configured to receive optical signals transmitted at a particular wavelength or channel, and may process the optical signals to obtain (e.g., demodulate) the information (i.e., data) that the optical signals contain. Accordingly, network 101 may include at least one receiver 112 for every channel of the network.

Optical networks, such as optical transport network 101 in FIG. 1, may employ modulation techniques to convey information in the optical signals over the optical fibers. Such modulation schemes may include phase-shift keying (PSK), frequency-shift keying (FSK), amplitude-shift keying (ASK), and quadrature amplitude modulation (QAM), among other examples of modulation techniques. Additionally, polarization division multiplexing (PDM) technology may enable achieving a greater bit rate for information transmission.

Modifications, additions or omissions may be made to optical transport network 101 without departing from the scope of the disclosure. For example, optical transport network 101 may include more or fewer elements than those depicted in FIG. 1. Also, as mentioned above, although depicted as a point-to-point network, optical transport network 101 may comprise any suitable network topology for transmitting optical signals such as a ring, a mesh, or a hierarchical network topology.

In some embodiments, optical signals connected to PIU modules may be interconnected and logically switched among the PIU modules in an optical transport network, such as optical transport network 101. Each of the PIU modules may function as a transceiver, with OTN inputs and outputs being respectively converted to Ethernet packets that are then switchable by one or more Ethernet switches. An Ethernet fabric may employ Ethernet switches in any kind of Ethernet switching architecture or Ethernet switching domain. For example, in various embodiments, the Ethernet fabric may be implemented as a hierarchical spine-leaf architecture, which has become commonplace in many data center rack domains. Thus, each rack may have a so-called top-of-rack (TOR) leaf switch that operates at a relative low data throughput capacity, while the TOR leaf switches are then interconnected using a spine switch that operates at a relatively high data throughput capacity. In this manner, the Ethernet fabric may be hierarchically implemented using different numbers of TOR leaf switches and spine switches for any given network switching application, including aggregation into very large throughput Ethernet fabrics that may have data throughput capacity of several dozens of terabytes, or even greater.

The interconnections between PIU modules and an Ethernet fabric may be copper cabled connections, such as 1000BASE-CX, 1000BASE-KX, 1000BASE-T, and 1000BASE-TX for 1 GB Ethernet; such as 10GBASE-CX4, small form factor pluggable+(SFP+), 10GBASE-T, and 10GBASE-KX4 for 10 GB Ethernet; and such as 100 GBASE-CR10, 100 GBASE-CR4, 100 GBASE-KR4, and 100 GBASE-KP4 for 100 GB Ethernet, among other potential types of copper-cable based ports. In some embodiments, the interconnections between PIU modules and an Ethernet fabric may be optical fiber Ethernet connections that are supported according to a variety of Ethernet standards for optical Ethernet ports. For example, for 100 GB Ethernet interconnections to the Ethernet fabric, the interconnections may be any one or more of 100 GBASE-SR10, 100 GBASE-SR4, 100 GBASE-LR4, 100 GBASE-ER4, 100 GBASE-CWDM4, 100 GBASE-PSM4, 100 GBASE-ZR, 100 GBASE-KR4, and 100 GBASE-KP4. For example, for up to 400 GB Ethernet interconnections to the Ethernet fabric, the interconnections may be any one or more of 400 GBASE-SR16, 400 GBASE-DR4, 400 GBASE-FR8, and 400 GBASE-LR8. Furthermore, in certain embodiments, interconnections to the Ethernet fabric may utilize FlexEthernet (FlexE) in order to mix different transmission rates across the Ethernet fabric.

Among the form factors for ports used in PIU modules are quad small form-factor pluggable (QFSP), C form-factor pluggable (CFP, CFP2), and SFP+. For example, CFP2 ports supporting analog coherent optics (ACO) may be used in PIU modules, such as for 100 gigabit (100 G) or 200 gigabit (200 G) coherent OTN connections. In some embodiments, a software-defined networking (SDN) controller may coordinate operation of a PIU blade chassis, including one or more PIU modules, and an Ethernet fabric, e.g., for OTN switching operations.

Figure 2:
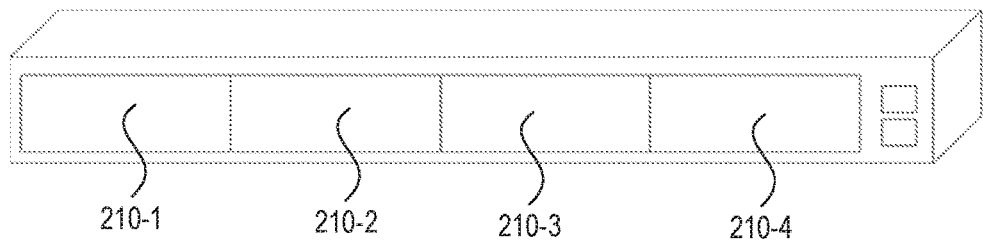
FIG. 2 is a block diagram of selected elements of an embodiment of a plug-in universal (PIU) chassis.

Referring now to FIG. 2, a representation of selected elements of an embodiment of a PIU chassis 200 is illustrated. PIU chassis 200 may be a rack-mounted enclosure having an internal bus and an internal processor. PIU chassis 200 may receive PIU modules via individual slots that connect a PIU module to the internal bus. The internal bus may provide power and signals for coordination among PIU modules. In certain embodiments, PIU chassis 200 may include a network connection for direct communication to an SDN controller (not shown in FIG. 2). In the illustrated embodiment, PIU chassis 200 includes four slots 210, each of which may be populated with an individual PIU module. In other embodiments, a PIU chassis may include a dual-port slot which may be populated by two PIU modules of a particular form factor, or a dual-port slot which may be populated by a single PIU module of a form factor that is wider than the PIU modules that populate single-port slots 210. It is noted that in different embodiments, PIU chassis 200 may include different numbers of slots 210, each of which may be implemented using the same or different form factors. In some embodiments, one or more of the PIU modules may include front side network connections for access to the PIU modules while they are installed in a slot 210 in PIU chassis 200.

The CFP Multi-Source Agreement (MSA) defines hot-pluggable optical transceiver form factors to enable 40 Gb/s, 100 Gb/s and 400 Gb/s applications, including High Speed Ethernet (40 GE, 100 GE and 400 GE) applications. Pluggable CFP, CFP2, CFP4 and CFP8 transceivers support optical transport networks and other types of data communication networks. Module dimensions for several commonly used form factors are shown in Table 1 below.

TABLE 1

PIU module dimensions

| Form factor | Width | Height | Length |
|---|---|---|---|
| CFP | 82 mm | 13.6 mm | 144.8 mm |
| CFP2 | 41.5 mm | 12.4 mm | 107.5 mm |
| CFP4 | 21.5 mm | 9.5 mm | 92 mm |

In particular embodiments, a CFP2 module is designed to be plugged into a host cage assembly (also referred to herein as a PIU module enclosure) along with which a grounding assembly may be installed. The enclosure may be fabricated within the host system and the CFP2 module may be inserted at a later time. The CFP MSA describes example dimensions for the enclosures (e.g., single- or dual-port cage systems). The dimensions of an opening in the enclosure through which the optical module is exposed may be different for particular host systems. In at least some embodiments, the grounding clip may be fabricated from a metal or metal alloy that exhibits spring properties.

Figure 3A:
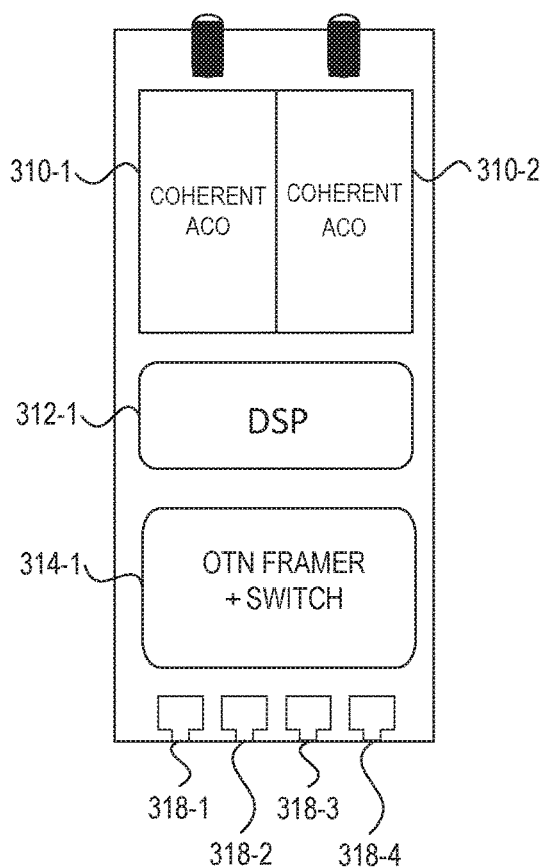
FIGS. 3A, 3B, and 3C are block diagrams of selected elements of embodiments of PIU modules.
Figure 3B:
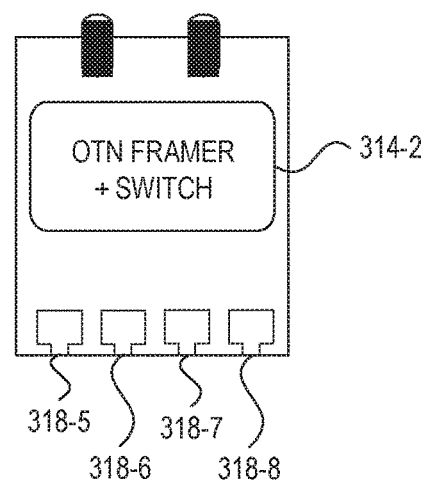
Figure 3C:
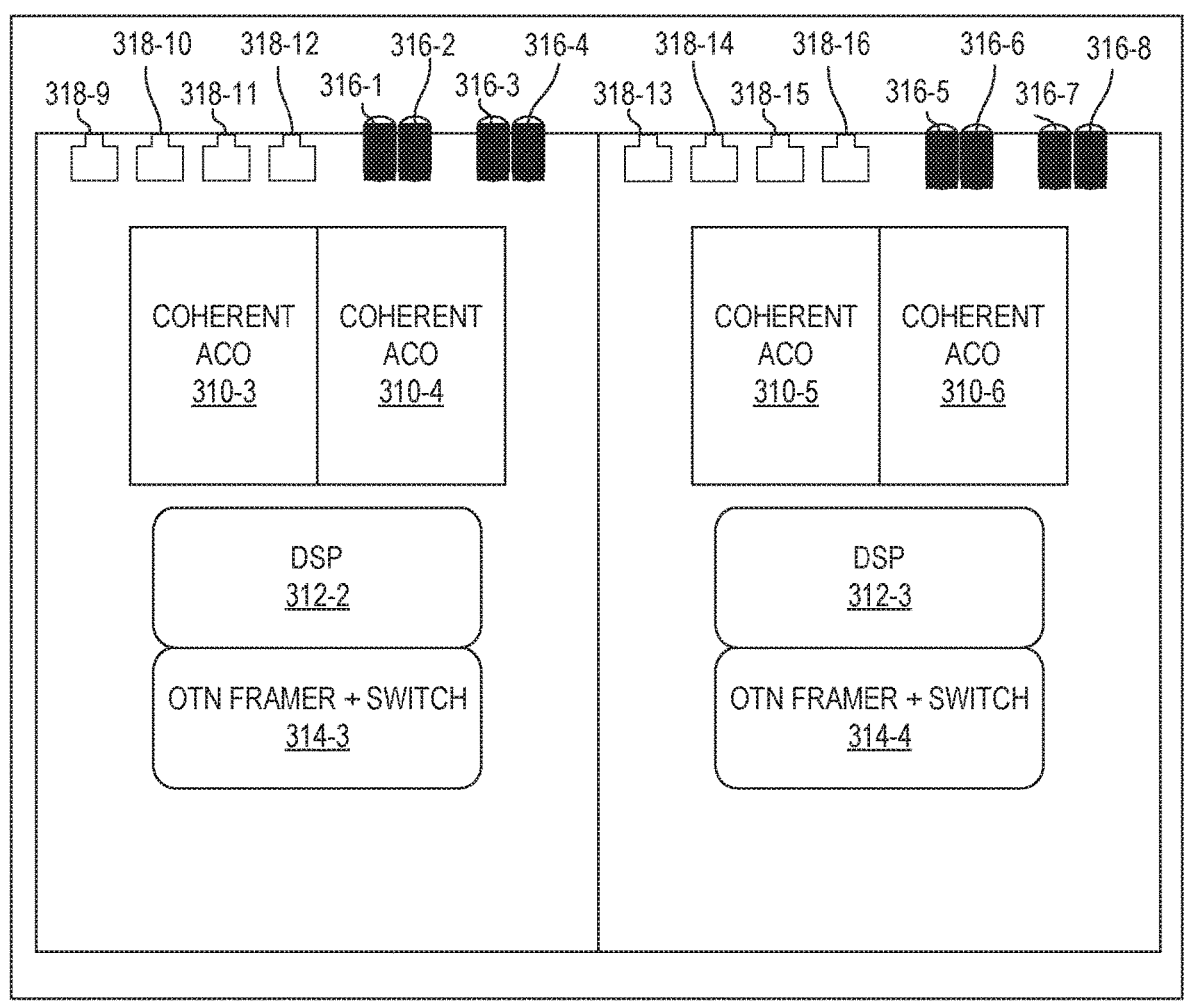

FIGS. 3A, 3B, and 3C are block diagrams of selected elements of example embodiments of PIU modules. More specifically, FIG. 3A is a block diagram of selected elements of an example embodiment of a coherent PIU module 301. FIG. 3A is a schematic illustration. Coherent PIU module 301 may populate one slot 210 in PIU chassis 200 illustrated in FIG. 2. In the example embodiment shown in FIG. 3A, coherent PIU module 301 includes two ACO transceivers 310, for example, that support 100 G or 200 G OTN lines and 100 G Ethernet. Coherent PIU module 301 may further include a DSP 312-1 and an OTN framer plus switch element 314-1, among other elements. Coherent PIU module 301 may include various connector ports 318 for optical or copper wire based connections, in particular embodiments.

FIG. 3B is a block diagram of selected elements of an example embodiment of a client PIU module 302. FIG. 3B is a schematic illustration. Client PIU module 302 may populate one slot 210 in PIU chassis 200. In the example embodiment shown in FIG. 3B, client PIU module 302 may implement 16×10 G Ethernet/4×40 G Ethernet and 100 G Ethernet. Client PIU module 302 may include an OTN framer plus switch element 314-2, among other elements. Client PIU module 302 may include various connector ports 318 for optical or copper wire based connections, in particular embodiments.

FIG. 3C is a block diagram of selected elements of an example embodiment of a high density PIU module 303. FIG. 3C is a schematic illustration. High density PIU module 303 may populate two slots 210 in PIU chassis 200. In the example embodiment shown in FIG. 3C, high density PIU module 303 includes two submodules that may be similar to coherent PIU module 301, but in which each submodule supports 2×100 G OTN lines. High density PIU module 303 may further include 1×40 G Ethernet/10×10 G Ethernet client ports, 16×10 G Ethernet ports, four coherent ACO transceivers 310-3 to 310-6, two DSPs 312-3 and 312-4, and two OTN framer plus switch elements 314-3 and 314-4, among other elements. High density PIU module 303 may include various OTN inputs and outputs 316-1 to 316-8 (shown as cylindrical ports). High density PIU module 303 may also include various connector ports 318-9 to 318-16 for breaking out various optical or copper wire based connections, in particular embodiments.

In some embodiments, a controller may maintain a database that associates PIU modules with respective PIU slots in a host system. For example, an SDN controller may maintain a database, stored in a memory, that associates PIU modules of particular types with particular slots 210 in a PIU rack or chassis 200. In one example, information maintained in the database may be provided to the chassis blade(s) and the PIU modules during a system boot up or configuration. In another example, information maintained in the database may be provided to the chassis blade(s) and the PIU modules during a system restart or reconfiguration.

As system performance and throughput requirements for optical transport networks continue to increase, various components of the PCBs included in network elements may be replaced by higher performance components. For example, some field-programmable gate arrays (FPGAs) may be replaced with faster FPGAs or with high-performance application-specific integrated circuit (ASIC) chips. In some cases, these faster or higher performance components may be more susceptible to or may react more quickly to static electricity, making it difficult for the network elements to pass ESD compliance testing requirements. For example, if PCBs containing these faster or higher performance components do not have sufficient grounding contact to the chassis frame, they may experience higher levels of ESD failure. In addition, many PIU module enclosures include a plastic faceplate whose relatively high impedance may exacerbate grounding issues. Some existing systems address these issues by creating electrical connections through the PCB, which may not be efficient for the newer designs that include faster FPGAs and ASIC chips. Other systems address these issues through the use of expensive metal faceplates or through modifications of the faceplate itself.

In at least some embodiments, the grounding assemblies described herein may make a direct mechanical connection between the PIU module enclosures, the PCB, and the chassis, thus solving the ESD issues that may be exhibited in high performance optical network elements. More specifically, the disclosed grounding clips may provide direct mechanical grounding from the PIU module enclosures to the chassis.

Figure 4:
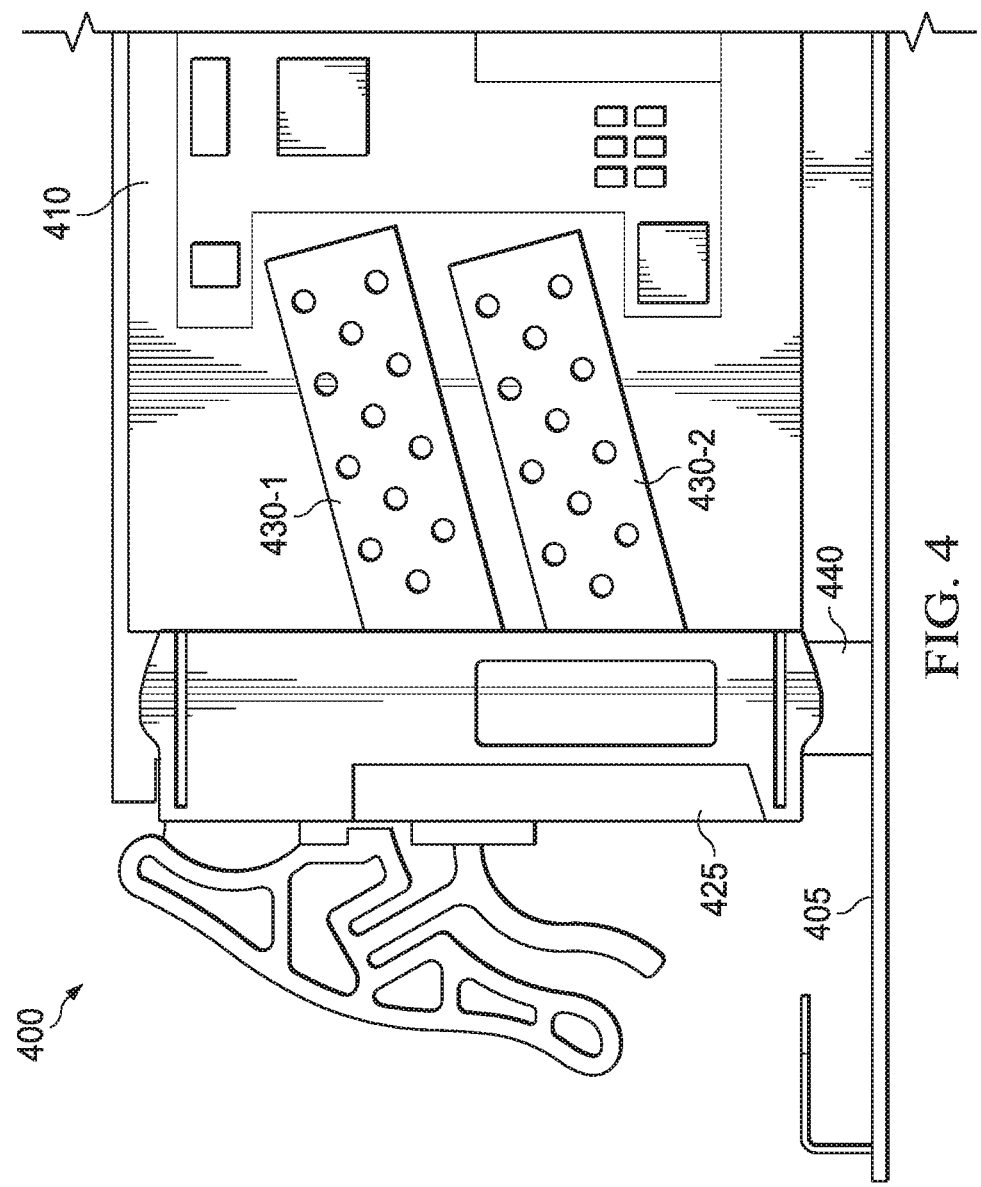
FIG. 4 illustrates selected elements of an example optical network element in which two PIU module enclosures are installed, in accordance with some embodiments.

FIG. 4 illustrates selected elements of an example optical network element 400 in which two PIU module enclosures are installed and into which a grounding assembly such as those described herein may be installed, in accordance with some embodiments. In the illustrated example, the network element includes a rack 405, a chassis 440 within which two PIU module enclosures shown as 430-1 and 430-2 are installed, a PCB 410 including one or more high performance components, and a plastic faceplate 425 mechanically coupled to the PCB through which a respective PIU module can be inserted into each of the PIU module enclosures 430 when installing the PIU module in the network element.

In the illustrated example, a respective PIU module may be installed into each of the PIU module enclosures 430 by sliding it through the faceplate 425 and into the PIU module enclosure 430. The PIU module may also be communicably coupled to the PCB when installed in the network element 400. The network element 400 may be installed in the rack 405, with or without a grounding clip assembly, before or after a PIU module is installed in one or both of the PIU module enclosures 430.

In the illustrated example, prior to installation of the grounding assembly, the network element 400 might not pass ESD compliance testing. For example, ESD compliance guidelines may specify that the network element 400 should be immune to ESD pulses of particular shapes and magnitudes. An ESD simulator, also referred to as an "ESD gun" may be used to test the immunity of the network element 400 to ESD pulses. Without the grounding assembly, when an ESD pulse of 9 kilovolts is applied to the network element 400 shown in FIG. 4 using an ESD gun, the ESD pulse may cause the system to be reset, thus failing the ESD compliance test. In some experiments, a network element 400 without a grounding assembly experienced a failure rate of up to 60%. If a similar ESD pulse occurs when the network element is deployed in the field, this reset response may cause the optical network element to drop traffic, resulting in dropped connections between devices on the optical network, such as mobile phones, and lost data, which are highly undesirable responses.

While the ESD immunity of the network element 400 may be improved, although not necessarily completely solved, by the replacement of the plastic faceplate 425 with a metal faceplate, this potential solution may add significant time and/or cost to the manufacturing of the network element. For example, a metal faceplate may cost ten times as much as a plastic faceplate, in some cases. In one experiment, the addition of foil tape between the PIU module enclosure and the PCB was shown to improve the pass rate for ESD compliance slightly, such as up to 60%, but not significantly enough to warrant its inclusion in the network element design.

In various embodiments, the grounding assemblies described herein may be used to providing a grounding solution in which electrical and mechanical connections are made between the PIU module enclosures 430, the PCB 410, and the chassis 440.

FIG. 5 illustrates selected elements of an optical network element 500 in which a first example grounding assembly is installed, in accordance with some embodiments. In this example embodiment, elements similar to those shown in FIG. 4 are labeled using the same reference numbers as in FIG. 4. For example, network element 500 includes two PIU module enclosures shown as 430-1 and 430-2, a PCB 410, and a plastic faceplate 425. In at least some embodiments, each of the PIU module enclosures 430 may include one or more ventilation perforations 540 through which heat from an installed PIU module may be dissipated.

Additional elements of network element 500 include a first example grounding clip 510 and two screws 515 which, collectively, represent a first example grounding assembly for a PIU module enclosure. The grounding assembly includes a grounding clip and fasteners that together cause the PIU module enclosures to be grounded to the chassis 440. In the illustrated embodiment, the grounding clip snaps in place to couple together two PIU module enclosures for grounding. More specifically, the grounding clip 510 is installed in a position at which it contacts an exposed surface of the PIU and is electrically and mechanically connected to the chassis 440 through the PCB 410 using two screws.

In the illustrated example, grounding clip 510 includes two wing portions for grounding the PIU module enclosures to the chassis. More specifically, grounding clip 510 includes a first wing portion 520-1 positioned between a first side of the faceplate 425 and the chassis such that the wing portion 520-1 is in contact with the first side of the faceplate 425 and the chassis when the grounding assembly is installed in the network element 500, and a second wing portion 520-2 positioned between a second side of the faceplate 425 and the chassis such that the wing portion 520-2 is in contact with the second side of the faceplate 425 and the chassis when the grounding assembly is installed in the network element 500, the second side of the faceplate 425 being opposite the first side of the faceplate 425.

In the illustrated example, a center portion of the grounding clip 510 between the first wing portion and the second wing portion is shaped to extend over and to be in contact with a relatively small portion of an exposed surface of each of the PIU module enclosures 430 when the grounding assembly is installed in the network element.

In the illustrated example, the grounding assembly includes fasteners to electrically and mechanically couple the grounding clip to the PCB when the grounding assembly is installed in the network element. More specifically, the grounding assembly includes a first screw 515-1 to attach one side of the grounding clip 510 to the PCB 410 and a second screw 515-2 to attach the opposite side of the grounding clip 510 to the PCB 410. In some experiments, the use of a grounding clip such as grounding clip 510 significantly improved the rate at which a network element such as network element 500 passed ESD compliance tests using a relatively low cost solution. For example, in one experiment in which an ESD pulse of 9 kilovolts was applied, using an ESD gun, to the network element 500 including the first example grounding assembly, the network element 500 experienced an improved failure rate of 20% or less.

Figure 6A:
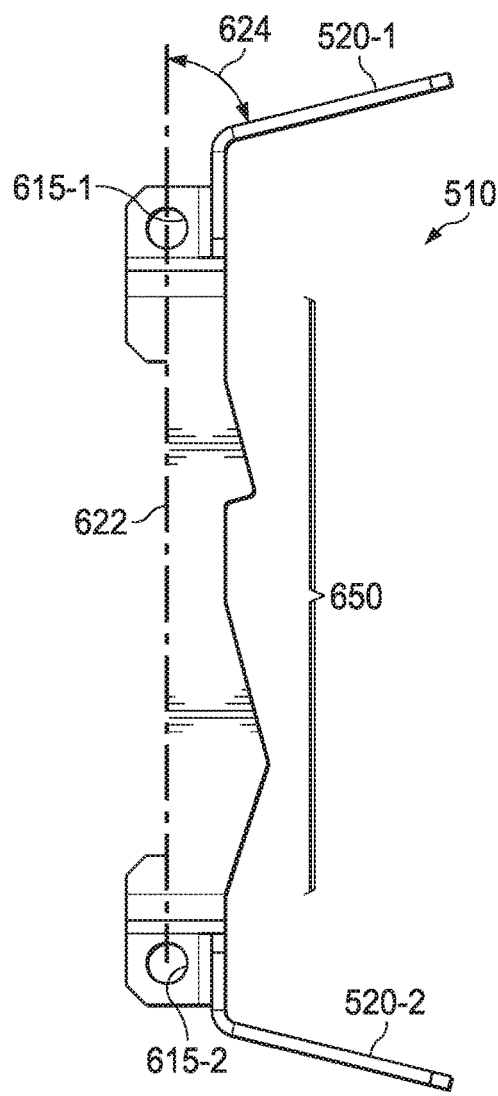
FIGS. 6A-6B illustrate respective views of the grounding clip shown in FIG. 5.
Figure 6B:
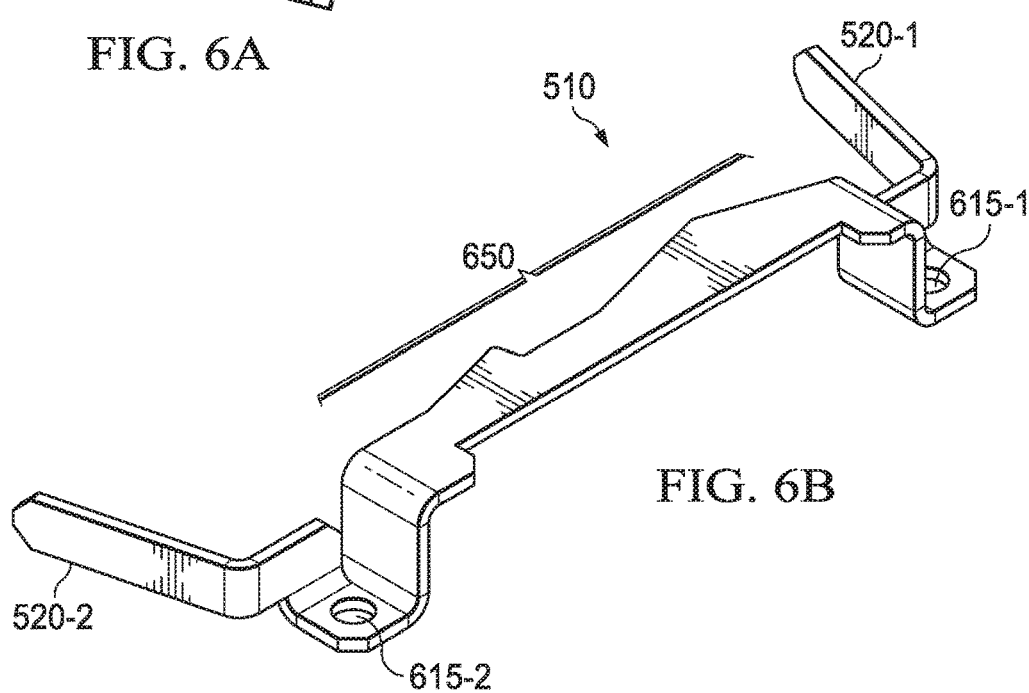

FIGS. 6A and 6B illustrate respective views of the grounding clip 510 shown in FIG. 5. More specifically, FIG. 6A illustrates a top view of grounding clip 510 and FIG. 6B illustrates an isometric view of grounding clip 510. As illustrated in FIGS. 6A and 6B, the first wing portion 520-1 is shaped to snap onto the first side of the faceplate 425 and to exert a force on the chassis to hold the grounding clip 510 in position to make contact with the chassis (not shown) and the second wing portion 520-1 is shaped to snap onto the second side of the faceplate 425 and to exert a force on the chassis to hold the grounding clip 510 in position to make contact with the chassis. Grounding clip 510 also includes a center portion, shown as center portion 650.

In at least some embodiments, the first wing portion 520-1 may extend away from the first side of the center portion 650 in a direction toward the faceplate 425 at an angle of between 70 and 80 degrees with respect to a line running across the center portion 650 between the first and second wing portions, and the second wing portion 520-2 may extend away from the second side of the center portion 650 opposite the first side of the center portion 650 in a direction toward the faceplate 425 at an angle of between 70 and 80 degrees with respect to the line running across the center portion between the first and second wing portions. For example, in the illustrated embodiment, the first wing portion 520-1 extends away from the first side of the center portion 650 at an angle 624 of approximately 76 degrees with respect to center line 622 and the second wing portion 520-2 extends away from the second side of the center portion 650 at an angle of approximately 76 degrees with respect to the center line 622. In some embodiments, extending the wing portions 520 away from the center portion 650 at an angle less than 70 degrees may increase the risk that the wing portions do not make contact with the chassis correctly, causing the ground to be lost. Conversely, extending the wing portions 520 away from the center portion 650 at an angle greater than 80 degrees may increase the risk that the wing portions will catch on the chassis, making it difficult to remove the grounding clip 510.

In the example embodiment illustrated in FIGS. 6A and 6B, holes 615-1 and 615-2 are shaped and sized to allow the screws 515-1 and 515-2 shown in FIG. 5 to pass through the holes and to make contact with grounding clip 510, PCB 410, and chassis 440.

In at least some embodiments, the grounding clip 510 may be fashioned as a single piece of a metal or a metal alloy exhibiting spring properties to allow the wing portions 520 to snap into place between the faceplate and the chassis. In some embodiments, grounding clip 510 may be fabricated from copper, which is more conductive than steel, for example. In the illustrated embodiment, grounding clip 510 may be fabricated from a copper material with a nickel finish to reduce oxidation. In other embodiments, grounding clip 510 may be fabricated from a spring coil roll, steel, or carbon steel with a springy finish, among other materials.

While the example grounding clip 510 illustrated in FIGS. 5, 6A, and 6B is shaped to providing grounding for two PIU module enclosures installed within an optical network element, in other embodiments a grounding clip including two wing portions that are configured for installation between a network element faceplate and a chassis frame, and holes for one or more fasteners to electrically and mechanically couple the grounding clip to the chassis through the PCB, may include a center portion shaped to extend over and to be in contact with at least a portion of a single PIU module enclosure or may be shaped to extend over and to be in contact with at least a portion of each of more than two PIU module enclosures into which respective PIU modules may be installed.

While the center portion of the example grounding clip 510 illustrated in FIGS. 5, 6A, and 6B is shaped to extend over and to be in contact with only a small portion of an exposed surface of PIU module enclosures 520-1 and 520-2, in other embodiments, the center portion of the grounding clip may be shaped to extend over and to be in contact with greater than fifty percent of an exposed surface of each of the PIU module enclosures when the grounding assembly is installed in the network element. An example embodiment in which the center portion of the grounding clip is shaped to extend over and to be in contact with almost the entire exposed surface of two PIU module enclosures installed in a network element is illustrated in FIGS. 7, 8A, and 8B.

Figure 7:
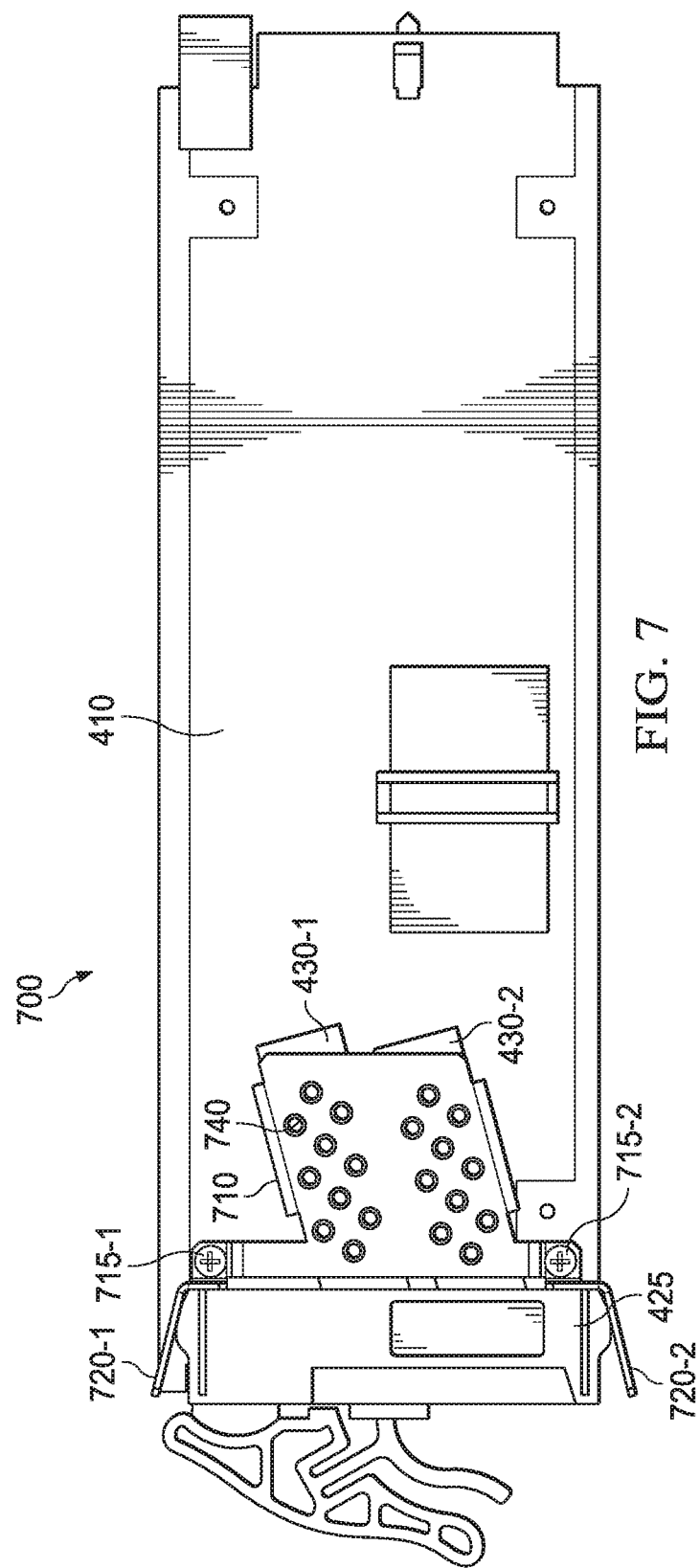
FIG. 7 illustrates selected elements of an optical network element in which a second example grounding assembly is installed, in accordance with some embodiments.
Figure 8A:
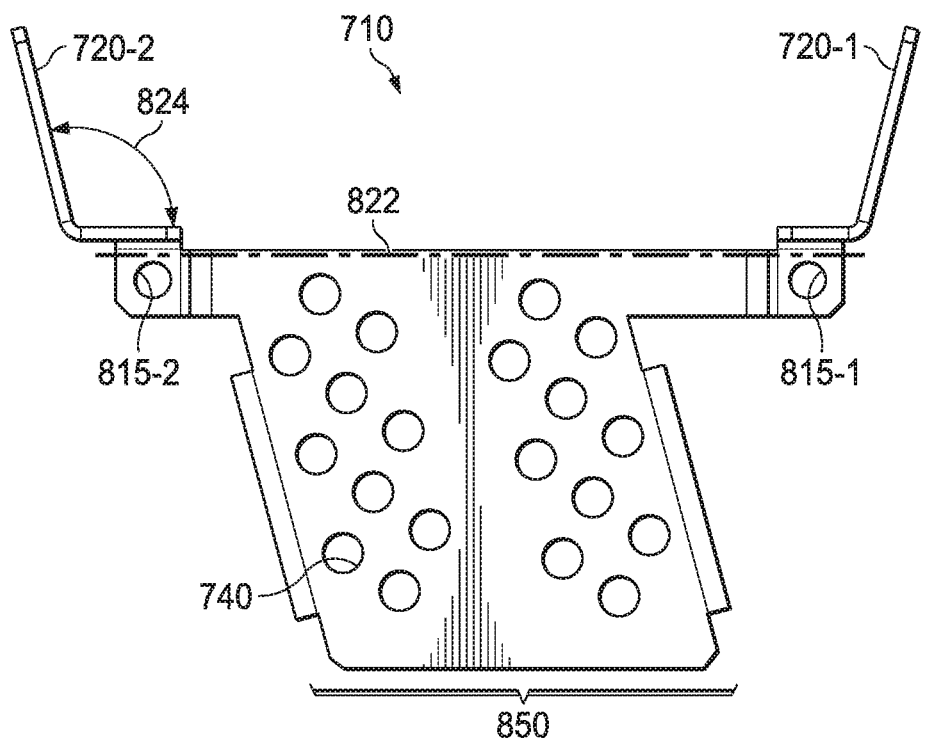
FIGS. 8A-8B illustrate respective views of the grounding clip shown in FIG. 7.
Figure 8B:
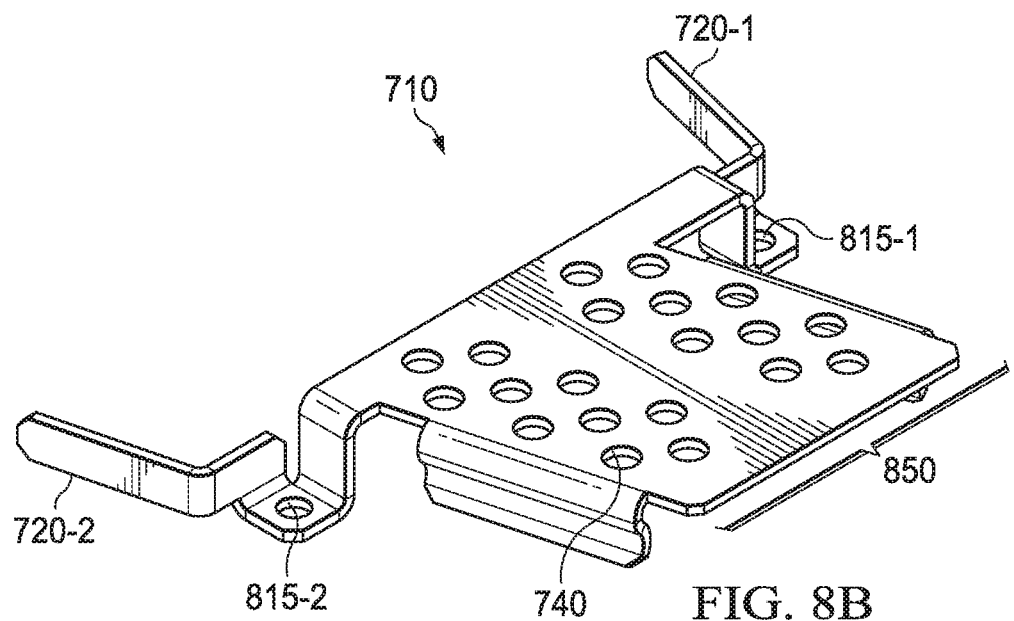

FIG. 7 illustrates selected elements of an optical network element 700 in which a second example grounding assembly is installed, in accordance with some embodiments. In this example embodiment, elements similar to those shown in FIGS. 4, 5, 6A, and 6B are labeled using the same reference numbers as in FIGS. 4, 5, 6A, and 6B. For example, network element 700 includes two PIU module enclosures shown as 430-1 and 430-2, a PCB 410, and a plastic faceplate 425. In at least some embodiments, each of the PIU module enclosures 430 may include one or more ventilation perforations (not visible in FIG. 7) through which heat generated by an installed PIU module may be dissipated to prevent overheating.

Additional elements of network element 700 include a second example grounding clip 710 and two screws 715 which, collectively, represent a second example grounding assembly for a PIU module enclosure. As in the previous example, the grounding assembly includes a grounding clip and fasteners that together cause the PIU module enclosures installed in network element 700 to be grounded to the chassis. In the illustrated embodiment, the grounding clip snaps in place to couple together two PIU module enclosures for grounding. More specifically, the grounding clip 710 is installed in a position in which it contacts an exposed surface of the PIU and is electrically and mechanically connected to the chassis through the PCB 410 using the two screws 715-1 and 715-2.

In the illustrated example, grounding clip 710 includes two wing portions for grounding the PIU module enclosures to the chassis. More specifically, grounding clip 710 includes a first wing portion 720-1 positioned between a first side of the faceplate 425 and the chassis such that the wing portion 720-1 is in contact with the first side of the faceplate 425 and the chassis when the grounding assembly is installed in the network element 700, and a second wing portion 720-2 positioned between a second side of the faceplate 425 and the chassis such that the wing portion 720-2 is in contact with the second side of the faceplate 425 and the chassis when the grounding assembly is installed in the network element 700, the second side of the faceplate 425 being opposite the first side of the faceplate 425.

In the example embodiment illustrated in FIG. 7, a center portion of the grounding clip 710 between the first wing portion and the second wing portion is shaped to extend over and to be in contact with a relatively large portion of an exposed surface of each of the PIU module enclosures 430 when the grounding assembly is installed in the network element. For example, in the illustrated embodiment, the center portion 850 of the grounding clip 710 is shaped to extend over and to be in contact with greater than fifty percent of an exposed surface of each of the PIU module enclosures when the grounding assembly is installed in the network element. This increases the amount of contact between the grounding clip 710 and the PIU module enclosures 430, which may significantly improve the ESD performance of the network element. In some embodiments, the center portion 850 of the grounding clip 710 may be shaped to extend over and to be in contact with the entire surface area of an exposed surface of each of the PIU module enclosures.

In the illustrated example, the center portion of grounding clip 710 includes multiple perforations that are aligned with respective ventilation perforations (not visible in FIG. 7) on the PIU module enclosures 430 when the PIU module enclosures 430 and the grounding clip 710 are installed in the network element. These perforations may allow heat generated by installed PIU modules to be dissipated, preventing overheating. For example, a perforation 740 of grounding clip 710 may be aligned with one of the perforations in the PIU module enclosure 430-1 (such as one of the perforations 540 in the PIU module enclosure 430-1 shown in FIG. 5) when the grounding clip 710 and the PIU module enclosure 430-1 are installed in the network element.

In some embodiments, the center portion of the grounding clip 710 includes one or more perforations that are aligned with respective ventilation perforations on a PIU module enclosure of a first enclosure type when the PIU module enclosure of the first enclosure type is installed in the network element and one or more additional perforations that are aligned with respective ventilation perforations on a PIU module enclosure of a second enclosure type when the PIU module enclosure of the second enclosure type is installed in the network element. In some embodiments, the center portion of the grounding clip 710 may include perforations that are aligned with respective ventilation perforations on PIU module enclosures of three or more enclosure types.

In the illustrated example, the grounding assembly includes fasteners to electrically and mechanically couple the grounding clip to the PCB when the grounding assembly is installed in the network element. More specifically, the grounding assembly includes a first screw 715-1 to attach one side of the grounding clip 710 to the PCB 410 and a second screw 715-2 to attach the opposite side of the grounding clip 710 to the PCB 410. In some experiments, the use of a grounding clip such as grounding clip 710 significantly improved the rate at which a network element such as network element 700 passed ESD compliance tests using a relatively low cost solution. For example, in one experiment in which an ESD pulse of 9 kilovolts was applied, using an ESD gun, to the network element 700 including the second example grounding assembly, the network element 700 consistently passed the ESD compliance tests.

FIGS. 8A and 8B illustrate respective views of the grounding clip 710 shown in FIG. 7. More specifically, FIG. 8A illustrates a top view of grounding clip 710 and FIG. 8B illustrates an isometric view of grounding clip 710. As illustrated in FIGS. 8A and 8B, the first wing portion 720-1 is shaped to snap onto the first side of the faceplate 425 and to exert a force on the chassis to hold the grounding clip 710 in position to make contact with the chassis (not shown) and the second wing portion 720-1 is shaped to snap onto the second side of the faceplate 425 and to exert a force on the chassis to hold the grounding clip 710 in position to make contact with the chassis. Grounding clip 710 also includes a center portion, shown as center portion 850.

In at least some embodiments, the first wing portion 720-1 may extend away from the first side of the center portion 850 in a direction toward the faceplate 425 at an angle of between 70 and 80 degrees with respect to a line running across the center portion 850 between the first and second wing portions, and the second wing portion 720-2 may extend away from the second side of the center portion 850 opposite the first side of the center portion 850 in a direction toward the faceplate 425 at an angle of between 70 and 80 degrees with respect to the line running across the center portion between the first and second wing portions. For example, in the illustrated embodiment, the first wing portion 720-1 extends away from the first side of the center portion 850 at an angle 824 of approximately 76 degrees with respect to center line 822 and the second wing portion 720-2 extends away from the second side of the center portion 850 at an angle of approximately 76 degrees with respect to the center line 822. In some embodiments, extending the wing portions 720 away from the center portion 850 at an angle less than 70 degrees may increase the risk that the wing portions do not make contact with the chassis correctly, causing the ground to be lost. Conversely, extending the wing portions 720 away from the center portion 850 at an angle greater than 80 degrees may increase the risk that the wing portions will catch on the chassis, making it difficult to remove the grounding clip 710.

In the example embodiment illustrated in FIGS. 8A and 8B, holes 715-1 and 715-2 are shaped and sized to allow the screws 715-1 and 715-2 shown in FIG. 7 to pass through the holes and to make contact with grounding clip 710, PCB 410, and chassis 440.

In at least some embodiments, the grounding clip 710 may be fashioned as a single piece of a metal or a metal alloy exhibiting spring properties to allow the wing portions 720 to snap into place between the faceplate and the chassis. In some embodiments, grounding clip 710 may be fabricated from copper, which is more conductive than steel, for example. In the illustrated embodiment, grounding clip 710 may be fabricated from a copper material with a nickel finish to reduce oxidation. In other embodiments, grounding clip 710 may be fabricated from a spring coil roll, steel, or carbon steel with a springy finish, among other materials.

While the example grounding clip 710 illustrated in FIGS. 7, 8A, and 8B is shaped to providing grounding for two PIU module enclosures installed within an optical network element, in other embodiments a grounding clip including two wing portions that are configured for installation between a network element faceplate and a chassis frame, and holes for one or more fasteners to electrically and mechanically couple the grounding clip to the chassis through the PCB, may include a center portion shaped to extend over and to be in contact with at a relatively large portion of a single PIU module enclosure or may be shaped to extend over and to be in contact with at a relatively large portion of each of more than two PIU module enclosures into which respective PIU modules may be installed. In various embodiments, multiple PIU module enclosures installed in a given network element may be of the same enclosure type or may be of two or more different enclosure types.

FIG. 9 illustrates a cutaway view of selected elements of an optical network element 900 in which a grounding assembly is installed, in accordance with some embodiments. More specifically, FIG. 9 illustrates a cutaway view of selected elements of optical network element 900 from the rear of network element 900. In the illustrated embodiment, the grounding assembly includes the grounding clip 710 illustrated in FIGS. 7, 8A, and 8B, which includes two wing portions 720, and two screws 715. In other embodiments, the grounding assembly may include a grounding clip such as grounding clip 510 illustrated in FIGS. 5, 6A, and 6B.

In the illustrated embodiment, the center portion of grounding clip 710 is shown in contact with a top surface of each of two PIU module enclosures. The wing portions of grounding clip 710, which is made of a metal or metal alloy with spring characteristics, snap onto the faceplate of the network element and exert a force against the chassis that holds the grounding clip in position between the faceplate and the chassis on opposite sides of the network element. Grounding clip 710 also includes holes 815-1 and 815-2 through which screws 715-1 and 715-2 are installed to electrically and mechanically couple grounding clip 710 to PCB 410 and the network element chassis.

FIG. 10 illustrates a rack 1000 for multiple network elements and an exploded view of one of the network elements, in accordance with some embodiments. More specifically, FIG. 10 illustrates a rack 1000 into which multiple network elements can be installed and a network element 1035 installed in the rack 1000.

As shown in the exploded view of network element 1035, two PIU module enclosures may be inserted through a plastic faceplate 1025 fabricated from a high impedance plastic material that is mechanically coupled to the chassis frame when installing the PIU module enclosures in the network element 1035. As illustrated in FIG. 10, two wing portions 720 of a grounding clip 710 may be snapped onto faceplate 1025 to hold grounding clip 710 in a position between and in contact with faceplate 1025 and the chassis frame. In the illustrated embodiment, a center portion of grounding clip 710 includes perforations that are aligned with respective ventilation perforations on one of the PIU module enclosures when the PIU module enclosure and the grounding clip 710 are installed in the network element.

Figure 11:
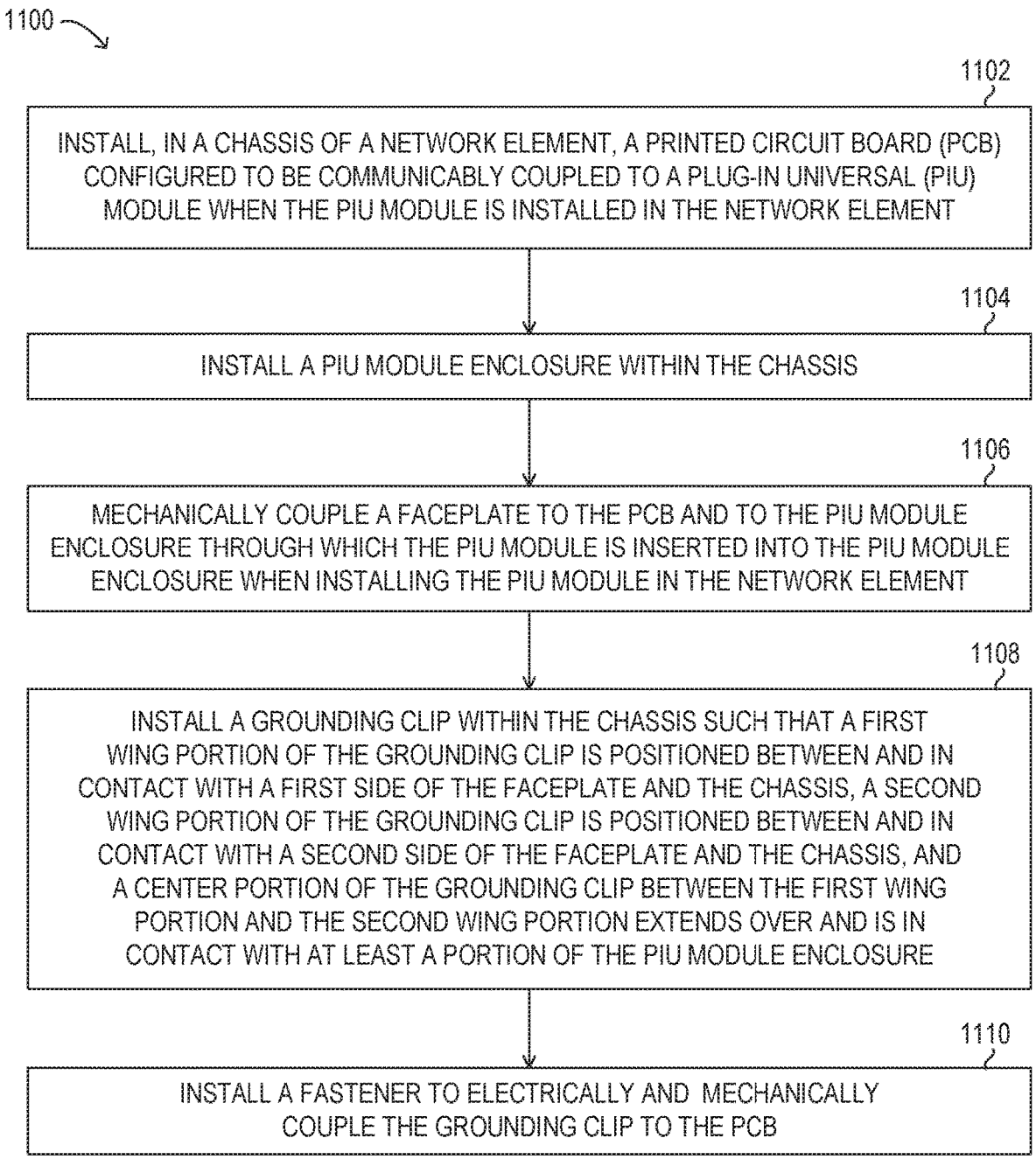
FIG. 11 is an embodiment of a method for installing a grounding assembly for an optical module, in accordance with some embodiments.

Referring now to FIG. 11, an embodiment of a method 1100 for installing a grounding assembly for an optical module is illustrated. At 1102, the method includes installing, in a chassis of a network element, a printed circuit board (PCB) configured to be communicably coupled to a plug-in universal (PIU) module when the PIU module is installed in the network element. In some embodiments, the PIU module may have a form factor consistent with the C form-factor pluggable (CFP) specification or a variant of the CFP specification (e.g., the CFP2 specification). In some embodiments, the PIU module may be or include a coherent optical transceiver module.

At 1104, the method includes installing a PIU module enclosure within the chassis. In some embodiments, the chassis may be configured for the installation of multiple PIU module enclosures of the same type or multiple PIU module enclosures of two or more different types.

At 1106, method 1100 includes mechanically coupling a faceplate to the PCB and to the PIU module enclosure through which the PIU module is inserted into the PIU module enclosure when installing the PIU module in the network element. In at least some embodiments, the faceplate may be made of a plastic material.

At 1108, the method includes installing a grounding clip within the chassis such that a first wing portion of the grounding clip is positioned between and in contact with first side of the faceplate and the chassis, a second wing portion of the grounding clip is positioned between and in contact with a second side of the faceplate and the chassis, and a center portion of the grounding clip between the first wing portion and the second wing portion extends over and is in contact with at least a portion of the PIU module enclosure. In at least some embodiments, the grounding clip may be fashioned as a single piece of a metal or a metal alloy exhibiting spring properties. Installing the grounding clip within the chassis may include snapping the first wing portion onto the first side of the faceplate and snapping the second wing portion onto the second side of the faceplate. The first wing portion may be shaped to exert a force on the chassis to hold the grounding clip in position to make contact with the first side of the faceplate and the chassis subsequent to installing the grounding clip and the second wing portion may be shaped to exert a force on the chassis to hold the grounding clip in position to make contact with the second side of the faceplate and the chassis subsequent to installing the grounding clip.

At 1110, the method includes installing a fastener to electrically and mechanically couple the grounding clip to the PCB. In some embodiments, the fastener may include one or more metal or metal alloy screws shaped to pass through respective openings in the grounding clip and the PCB. Installing the fastener may include inserting the screws through respective openings in the grounding clip and the PCB such that they make contact with the grounding clip, the PCB, and the chassis.

While specific examples of grounding assemblies and installation techniques are described herein in terms of their use with PIU modules in optical transport networks, in other embodiments, these grounding assemblies and installation techniques may be applied to pluggable modules of other types and/or in other applications.

In various embodiments, the grounding assemblies described herein may be used to mechanically couple PIU module enclosures in an optical network element to the PCB ground and to the chassis without solder or a pressing application. The grounding assemblies described herein may also be used to mechanically couple the PIU module enclosures directly to the chassis without going through the PCB for grounding.

The techniques described herein may enable relatively low cost solutions for network element designs that meet ESD compliance guidelines. In various embodiments, network elements containing plastic faceplates in which the grounding assemblies described herein are installed may be more profitable than network elements containing metal faceplates due to direct material costs. The grounding assemblies described herein may also provide a higher ESD safety margin for the network elements in which they are installed, minimizing customer downtime due to ESD restarts in the field.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A network element in an optical transport network, comprising:
   a plug-in universal (PIU) module enclosure into which a PIU module is received during installation of the PIU module in the network element;
   a chassis within which the PIU module enclosure is installed in the network element;
   a printed circuit board (PCB) installed within the chassis and configured to be communicably coupled to the PIU module when the PIU module is installed in the network element;
   a faceplate mechanically coupled to the PCB through which the PIU module is inserted into the PIU module enclosure when installing the PIU module in the network element; and
   a grounding assembly, comprising:
      a grounding clip, comprising:
         a first wing portion positioned between a first side of the faceplate and the chassis and in contact with the first side of the faceplate and the chassis when the grounding assembly is installed in the network element;
         a second wing portion positioned between a second side of the faceplate and the chassis and in contact with the second side of the faceplate and the chassis when the grounding assembly is installed in the network element, the second side of the faceplate being opposite the first side of the faceplate; and
         a center portion between the first wing portion and the second wing portion shaped to extend over and to be in contact with at least a portion of the PIU module enclosure when the grounding assembly is installed in the network element; and
      a fastener to electrically and mechanically couple the grounding clip to the PCB when the grounding assembly is installed in the network element.

2. The network element of claim 1, wherein:
   the grounding clip is fashioned as a single piece of a metal or a metal alloy exhibiting spring properties;
   the first wing portion is shaped to snap onto the first side of the faceplate and exert a force on the chassis to hold the grounding clip in position to make contact with the chassis; and
   the second wing portion is shaped to snap onto the second side of the faceplate and exert a force on the chassis to hold the grounding clip in position to make contact with the chassis.

3. The network element of claim 2, wherein
   the first wing portion extends away from a first side of the center portion in a direction toward the faceplate at an angle of between 70 and 80 degrees with respect to a line running across the center portion between the first and second wing portions; and the second wing portion extends away from a second side of the center portion opposite the first side of the center portion in a direction toward the faceplate at an angle of between 70 and 80 degrees with respect to the line running across the center portion between the first and second wing portions.

4. The network element of claim 1, wherein the faceplate is fashioned from a plastic material.

5. The network element of claim 1, wherein the center portion comprises one or more perforations that are aligned with respective ventilation perforations on the PIU module enclosure when the PIU module enclosure is installed in the network element.

6. The network element of claim 5, wherein:
the PIU module enclosure is a PIU module enclosure of a first enclosure type; and
the center portion further comprises one or more additional perforations that are aligned with respective ventilation perforations on a PIU module enclosure of a second enclosure type when the PIU module enclosure of the second enclosure type is installed in the network element.

7. The network element of claim 1, wherein the center portion is shaped to extend over and to be in contact with greater than fifty percent of a surface of the PIU module enclosure when the grounding assembly is installed in the network element.

8. The network element of claim 1, further comprising an additional PIU module enclosure into which an additional PIU module is received during installation of the additional PIU module in the network element, wherein the center portion is shaped to extend over and to be in contact with the at least a portion of the PIU module enclosure and at least a portion of the additional PIU module enclosure when the grounding assembly is installed in the network element.

9. The network element of claim 1, wherein the fastener comprises one or more screws shaped to pass through respective openings in the grounding clip and the PCB and to make contact with the chassis.

10. A grounding clip for a plug-in universal (PIU) module enclosure, comprising:
a first wing portion shaped to be positioned between a first side of a faceplate of an optical network element and a chassis within which the PIU module enclosure is installed in the network element such that the first wing portion is in contact with the first side of the faceplate and the chassis when the grounding clip is installed in the network element;
a second wing portion shaped to be positioned between a second side of the faceplate and the chassis such that the second wing portion is in contact with the second side of the faceplate and the chassis when the grounding clip is installed in the network element, the second side of the faceplate being opposite the first side of the faceplate;
a center portion between the first wing portion and the second wing portion shaped to extend over and to be in contact with at least a portion of the PIU module enclosure when the grounding assembly is installed in the network element; and
an opening through which a fastener electrically and mechanically couples the grounding clip to a printed circuit board (PCB) and to the chassis when the grounding assembly is installed in the network element, the PCB being installed within the chassis and configured to be communicably coupled to a PIU module when the PIU module is installed in the PIU module enclosure.

11. The grounding clip of claim 10, wherein:
the grounding clip is fashioned as a single piece of a metal or a metal alloy exhibiting spring properties;
the first wing portion is shaped to snap onto the first side of the faceplate and exert a force on the chassis to hold the grounding clip in position to make contact with the chassis; and
the second wing portion is shaped to snap onto the second side of the faceplate and exert a force on the chassis to hold the grounding clip in position to make contact with the chassis.

12. The grounding clip of claim 11, wherein
the first wing portion extends away from a first side of the center portion in a direction toward the faceplate at an angle of between 70 and 80 degrees with respect to a line running across the center portion between the first and second wing portions; and
the second wing portion extends away from a second side of the center portion opposite the first side of the center portion in a direction toward the faceplate at an angle of between 70 and 80 degrees with respect to the line running across the center portion between the first and second wing portions.

13. The grounding clip of claim 10, wherein the center portion comprises one or more perforations that are aligned with respective ventilation perforations on the PIU module enclosure when the PIU module enclosure and the grounding clip are installed in the network element.

14. The grounding clip of claim 10, wherein the center portion comprises:
one or more perforations that are aligned with respective ventilation perforations on a PIU module enclosure of a first enclosure type when the PIU module enclosure of the first enclosure type and the grounding clip are installed in the network element; and
one or more perforations that are aligned with respective ventilation perforations on a PIU module enclosure of a second enclosure type when the PIU module enclosure of the second enclosure type and the grounding clip are installed in the network element.

15. The grounding clip of claim 10, wherein the center portion is shaped to extend over and to be in contact with greater than fifty percent of a surface of the PIU module enclosure when the PIU module enclosure and the grounding assembly are installed in the network element.

16. The grounding clip of claim 10, wherein the center portion is shaped to extend over and to be in contact with the at least a portion of the PIU module enclosure and at least a portion of an additional PIU module enclosure when the PIU module enclosure, the additional PIU module enclosure, and the grounding assembly are installed in the network element.

17. A method for installing a grounding assembly for a plug-in universal (PIU) module in a chassis of a network element, comprising:
installing, in the chassis, a printed circuit board (PCB) configured to be communicably coupled to the PIU module when the PIU module is installed in the network element;
installing a PIU module enclosure within the chassis;
mechanically coupling a faceplate to the PCB and to the PIU module enclosure through which the PIU module is inserted into the PIU module enclosure when installing the PIU module in the network element;

installing a grounding clip within the chassis such that:
- a first wing portion of the grounding clip is positioned between a first side of the faceplate and the chassis so as to be in contact with the first side of the faceplate and the chassis;
- a second wing portion of the grounding clip is positioned between a second side of the faceplate and the chassis so as to be in contact with the second side of the faceplate and the chassis, the second side of the faceplate being opposite the first side of the faceplate; and
- a center portion of the grounding clip between the first wing portion and the second wing portion extends over and is in contact with at least a portion of the PIU module enclosure; and installing a fastener to electrically and mechanically couple the grounding clip to the PCB and to the chassis.

18. The method of claim 17, wherein:

the grounding clip is fashioned as a single piece of a metal or a metal alloy exhibiting spring properties;

installing the grounding clip within the chassis comprises:
- snapping the first wing portion onto the first side of the faceplate; and
- snapping the second wing portion onto the second side of the faceplate;

the first wing portion is shaped to exert a force on the chassis to hold the grounding clip in position to make contact with the first side of the faceplate and the chassis subsequent to installing the grounding clip; and the second wing portion is shaped to exert a force on the chassis to hold the grounding clip in position to make contact with the second side of the faceplate and the chassis subsequent to installing the grounding clip.

19. The method of claim 17, wherein installing the fastener comprises inserting one or more screws through respective openings in the grounding clip and the PCB such that they make contact with the grounding clip, the PCB, and the chassis.

20. The method of claim 17, further comprising fashioning the grounding clip from a single piece of a metal or a metal alloy exhibiting spring properties.

* * * * *